United States Patent
Chang et al.

(10) Patent No.: US 9,591,777 B2
(45) Date of Patent: Mar. 7, 2017

(54) COVER OPENING STRUCTURE

(71) Applicant: Acer Incorporated, New Taipei (TW)

(72) Inventors: Chun-Wei Chang, New Taipei (TW); Shun-Bin Chen, New Taipei (TW); Wu-Chen Lee, New Taipei (TW); Shih-Huai Chan, New Taipei (TW)

(73) Assignee: Acer Incorporated, New Taipei (TW)

( * ) Notice: Subject to any disclaimer, the term of this patent is extended or adjusted under 35 U.S.C. 154(b) by 283 days.

(21) Appl. No.: 14/210,471

(22) Filed: Mar. 14, 2014

(65) Prior Publication Data
US 2015/0189773 A1 Jul. 2, 2015

(30) Foreign Application Priority Data
Dec. 26, 2013 (TW) .............................. 102224520 U

(51) Int. Cl.
| | | |
|---|---|---|
| *B65D 45/16* | (2006.01) | |
| *B65D 17/50* | (2006.01) | |
| *B65D 41/02* | (2006.01) | |
| *B65D 43/26* | (2006.01) | |
| *G06F 1/16* | (2006.01) | |
| *H05K 5/02* | (2006.01) | |
| *H05K 5/00* | (2006.01) | |
| *B65F 1/16* | (2006.01) | |
| *F16M 11/10* | (2006.01) | |
| *F16M 11/12* | (2006.01) | |
| *B65D 43/22* | (2006.01) | |

(52) U.S. Cl.
CPC ......... *H05K 5/0217* (2013.01); *G06F 1/1626* (2013.01); *G06F 1/1675* (2013.01); *H05K 5/0004* (2013.01); *H05K 5/0086* (2013.01)

(58) Field of Classification Search
CPC ... G06F 1/1626; G06F 1/1675; H05K 5/0217; H05K 5/0221; H05K 5/0234; H05K 5/03; F16M 11/10; F16M 11/12; F16M 11/121; A45C 13/1084; A45C 13/123; A45D 40/222; A45D 2040/223; B65D 43/22; B65D 43/265; E05B 17/0033; E05B 17/0037; E05B 73/0023; B65F 1/1623
USPC ................................. 220/324, 260, 262, 263
See application file for complete search history.

(56) References Cited

U.S. PATENT DOCUMENTS 4,259,568 A * 3/1981 Dynesen ............. G06F 15/0216
  206/305
6,076,679 A * 6/2000 Yuhara ................. A45C 13/008
  132/294

(Continued)

*Primary Examiner* — Andrew T Kirsch
(74) *Attorney, Agent, or Firm* — Jianq Chyun IP Office

(57) ABSTRACT

A cover opening structure including a case, a cover, a pushing button, a pushing unit and an axle is provided. The cover has a first portion having a first side, a second portion having a second side connected to the case, and a connecting portion connected therebetween, wherein the connecting portion is softer than the first and second portions. The pushing button disposed on the case has a body and an inserting portion extended from the body. The pushing unit has a first end, a second end and a leaning portion connected therebetween and is inserted between the body and the first end. The axle is disposed at the case while the leaning portion leans against the axle. The pushing unit rotates about the axle while the first end moves downward and the second end moves upward to push up the first portion when the pushing button is moved.

6 Claims, 5 Drawing Sheets

(56) References Cited

U.S. PATENT DOCUMENTS 6,129,237 A    10/2000  Miyahara
2013/0301204 A1  11/2013  Yim et al.

* cited by examiner

COVER OPENING STRUCTURE

CROSS-REFERENCE TO RELATED APPLICATION

This application claims the priority benefit of Taiwan application serial no. 102224520, filed on Dec. 26, 2013. The entirety of the above-mentioned patent application is hereby incorporated by reference herein and made a part of this specification.

BACKGROUND

Field of the Application

The invention relates to a cover opening structure, and more particularly, to a cover opening structure enabling a user to open a cover with convenience.

Description of Related Art

With diversification in the development of mobile application (mobile App), current flat panel products gradually derive with other new usages from the original hand-held use features. As the time being spent by user on a Tablet PC increases, it requires a supporting structure to support the Tablet PC so as to provide the user with long-term use. FIG. 1 is a schematic diagram illustrating use states of a Tablet PC and an accessory cover thereof, and FIG. 2 is a schematic diagram illustrating a supporting structure being disposed at the back side of the Tablet PC. As shown in FIG. 1, it can be seen that a foldable cover 200a may support a Tablet PC 100a with different means. As shown in FIG. 2, a support piece 200b is used to support a Tablet PC 100b. Either use the supporting means illustrated in FIG. 1 or in FIG. 2, both supporting means are all provided for bringing the user with an ease of use.

SUMMARY OF THE APPLICATION

The invention provides a cover opening structure enabling a cover to open up from an electronic device with convenience.

The cover opening structure of the invention includes a case, a cover, a pushing button, a pushing unit and an axle. The cover has at least a first portion, a second portion and a connecting portion connected to the first portion and the second portion, wherein the connecting portion is softer than the first portion and the second portion. The first portion has a first side and the second portion has a second side, wherein the second side is connected to the case. The pushing button is disposed on the case and suitable for moving horizontally in relative to the case, wherein the pushing button has a body and an inserting portion extended from the body. The pushing unit has a first end, a second end and a leaning portion connected between the first end and the second end. The inserting portion is located between the body and the first end. The axle is disposed at the case, and the leaning portion leans against the axle. The inserting portion enables the pushing unit to rotate about the axle while the first end moves downward and the second end moves upward when the pushing button is moved, so as to push up the first portion of the cover.

The cover opening structure includes a case, a cover, an axle and a pressing button. The cover has at least one first portion, a second portion and a connecting portion connected to the first portion and the second portion, wherein the connecting portion is softer than the first portion and the second portion. The first portion has a first side and the second portion has a second side, wherein the second side is connected to the case. The axle is disposed at the case, the pressing button is pivoted on the axle and exposed outside of the case, and suitable for rotating about the axle in relative to the case, wherein the pressing button has a first end and a second end that are connected together perpendicularly, and the second end leans against the first portion. When the pressing button is subjected by pressure to rotate about the axle in relative to the case, the second end pushes up the first portion of the cover.

In view of above, the cover opening structure of the invention allows the user to open up the cover in relative to the case of the electronic device with less effort by means of pushing or pressing.

In order to make the aforementioned and other features and advantages of the present application more comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DETAILED DESCRIPTION OF DISCLOSED EMBODIMENTS

Figure 1:
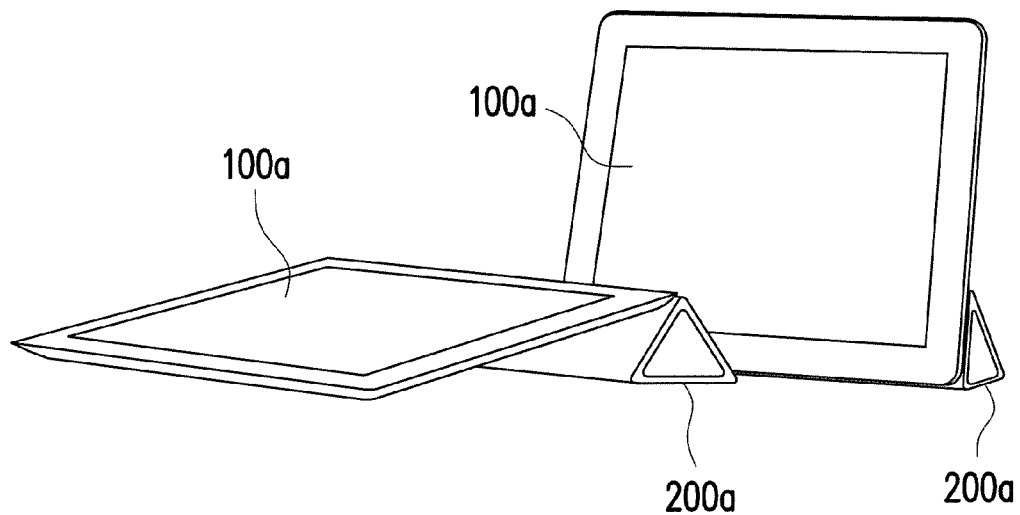
FIG. 1 is a schematic diagram illustrating use states of a Tablet PC and an accessory cover thereof
Figure 2:
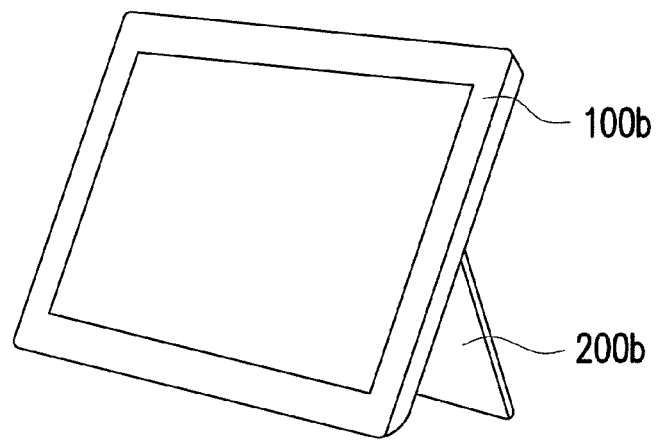
FIG. 2 is a schematic diagram illustrating a supporting structure being disposed at the back side of the Tablet PC.
Figure 3:
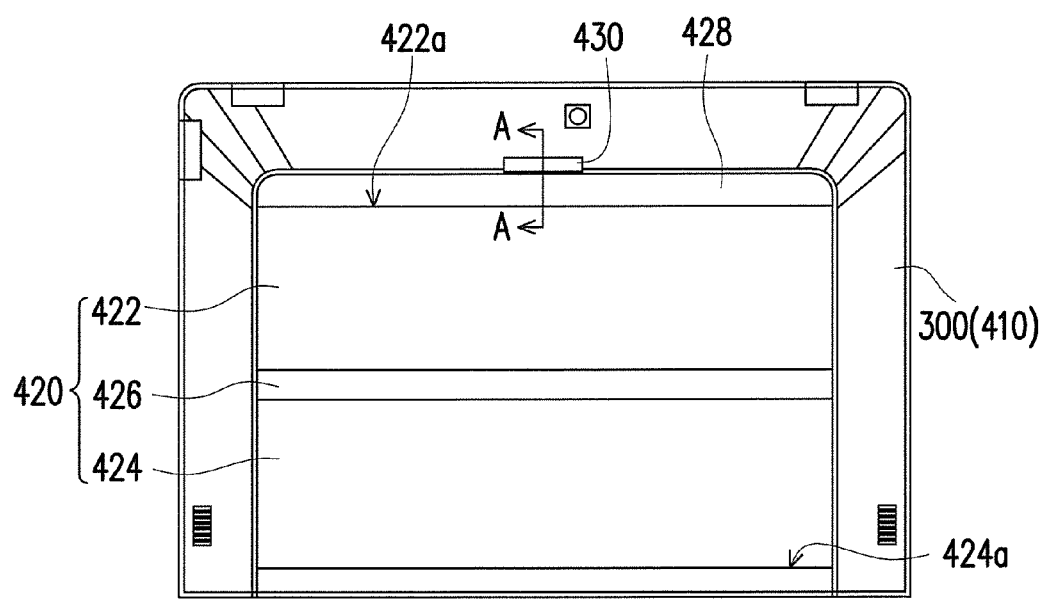
FIG. 3 is a schematic diagram illustrating a cover opening structure being applied to an electronic device according to a first embodiment of the invention.
Figure 4:
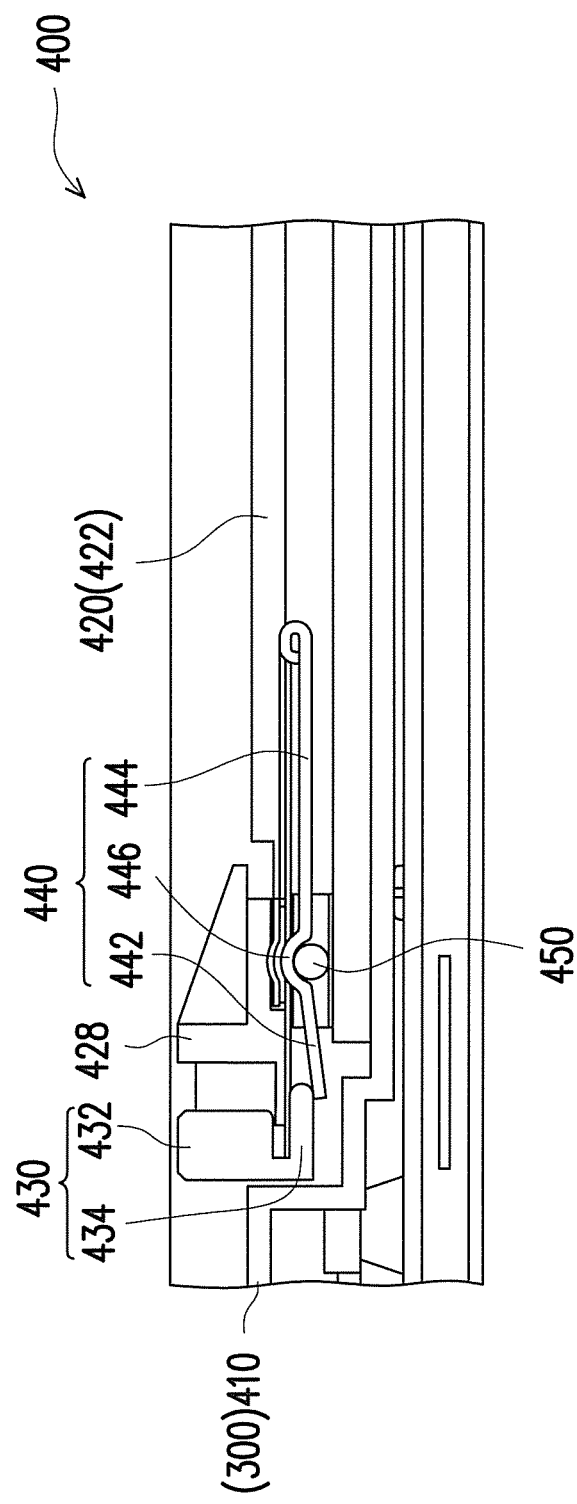
FIG. 4 is a partial cross-sectional diagram along a profile line A-A in FIG. 3.

FIG. 3 is a schematic diagram illustrating a cover opening structure being applied to an electronic device according to a first embodiment of the invention, and FIG. 4 is a partial cross-sectional diagram along a profile line A-A in FIG. 3. Referring to FIG. 3 and FIG. 4 at the same time, a cover opening structure 400 may, for example, be applied to a Tablet PC, a Smart Phone or other portable electronic device. The cover opening structure 400 includes a case 410, a cover 420, a pushing button 430, a pushing unit 440 and an axle 450. The case 410 is a case of an electronic device 300. The cover 420 is disposed on the case 410, wherein the cover 420 has a first portion 422, a second portion 424 and a connecting portion 426 connected between the first portion 422 and the second portion 424. The connecting portion 426 is softer than the first portion 422 and the second portion 424, and thus when the cover 420 is opened, the connecting portion 426 may cause an angle variation between the first portion 422 and the second portion 424, so that a user may fold the cover 420 into a supporting mode and use the folded cover 420 to support the electronic device 300.

Based on the above, the first portion 422 of the cover 420 has a first side 422a and the second portion 424 has a second side 424a, wherein the second side 424a is connected to the case 410. The connection mentioned herein may be referred to as: the cover 420 may be completely detached from the case 410 with convenience by using magnetic attraction, or the cover 420 is normally fixed on the case 410 by using mechanical means such as physical pivoting; and is designed according to actual requirements. The pushing button 430 is disposed on the case 410 and suitable for moving horizontally in relative to the case 410, wherein the pushing button 430 has a body 432 and an inserting portion 434 extended from the body 432. The pushing unit 440 has a first end 442, a second end 444 and a leaning portion 446 connected therebetween, and the inserting portion 434 is located between the body 432 and the first end 442. The axle 450 is disposed at the case 410. The leaning portion 446 of the present embodiment leans against the axle 450; however, in the other embodiments, the leaning portion 446 may also be ring-shaped, and the axle 450 passes through the ring-shaped leaning portion 446.

Based from the above, a material of the pushing unit 440 may be metal, and a material of the pushing button 430 may be plastic, which are selected based on the actual requirements. In addition, the cover 420 further includes a pulling rod portion 428, and the pulling rod portion 428 is disposed at a first side 422a of the first portion 422. Hardness of the pulling rod portion 428 is greater than a hardness of the connecting portion 426, and the pushing button 430 is suitable for pushing the pulling rod portion 428.

Figure 5:
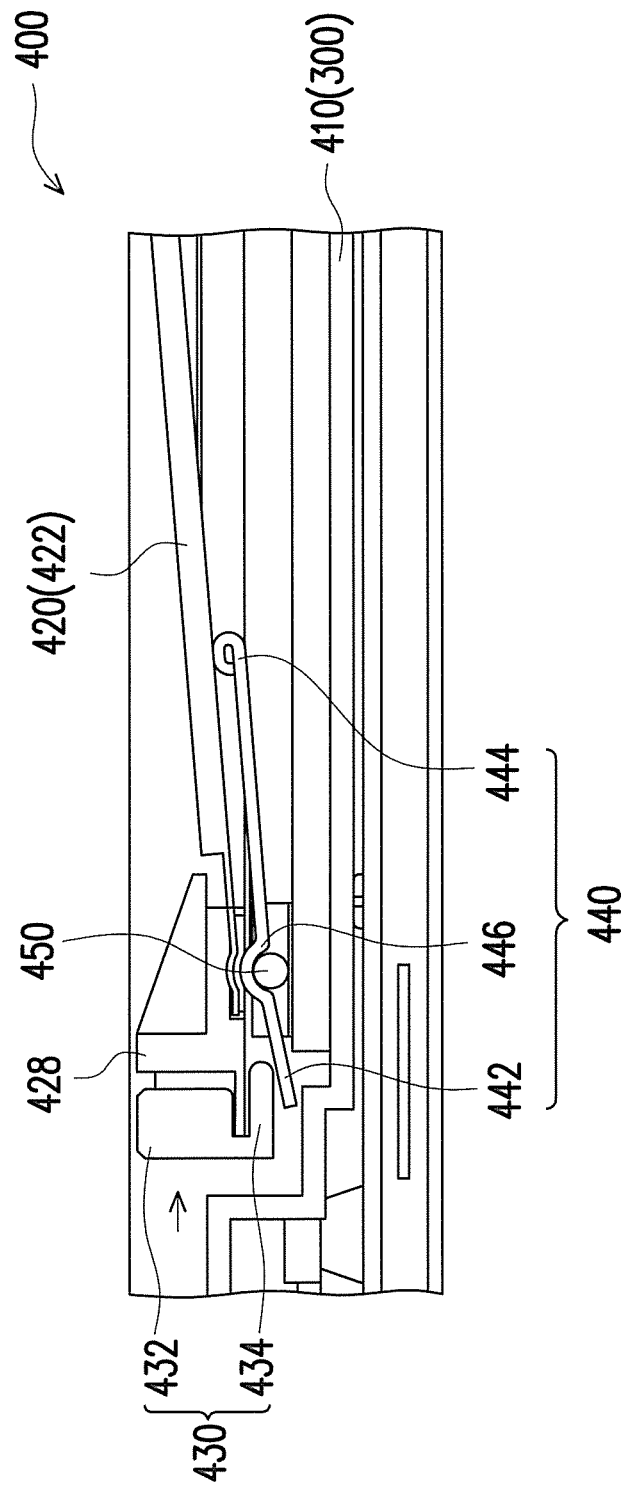
FIG. 5 is a schematic diagram illustrating a first portion of a cover being pushed up by a second end of a pushing unit when a pushing button is moved.
Figure 6:
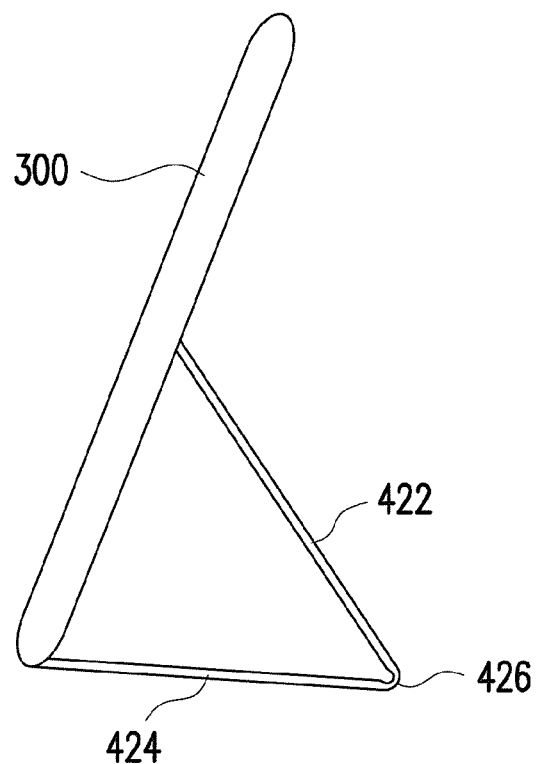
FIG. 6 is a schematic diagram illustrating the electronic device being supported by the cover.

FIG. 5 is a schematic diagram illustrating a first portion of a cover being pushed up by a second end of a pushing unit when a pushing button is moved. Referring to FIG. 3, FIG. 4 and FIG. 5 at the same time, when the user is to open up the cover 420 in relative to the case 410 of the electronic device 300, the user may push the pushing button 430, so that the insertion portion 434 of the pushing button 430 further presses against the first end 442 of the pushing unit 440, and the pushing unit 440 rotates about the axle 450 while the first end 442 moves downward and the second end 444 moves upwards, so that the first portion 422 of the cover 420 is being pushed up as the second end 444 moves upward. After the first portion 422 of the cover 420 is being pushed up, the user may pull the first portion 422 of the cover 420 with less effort, so that the cover 420 is folded into a shape capable of supporting the electronic device 300, as shown in FIG. 6.

Figure 7:
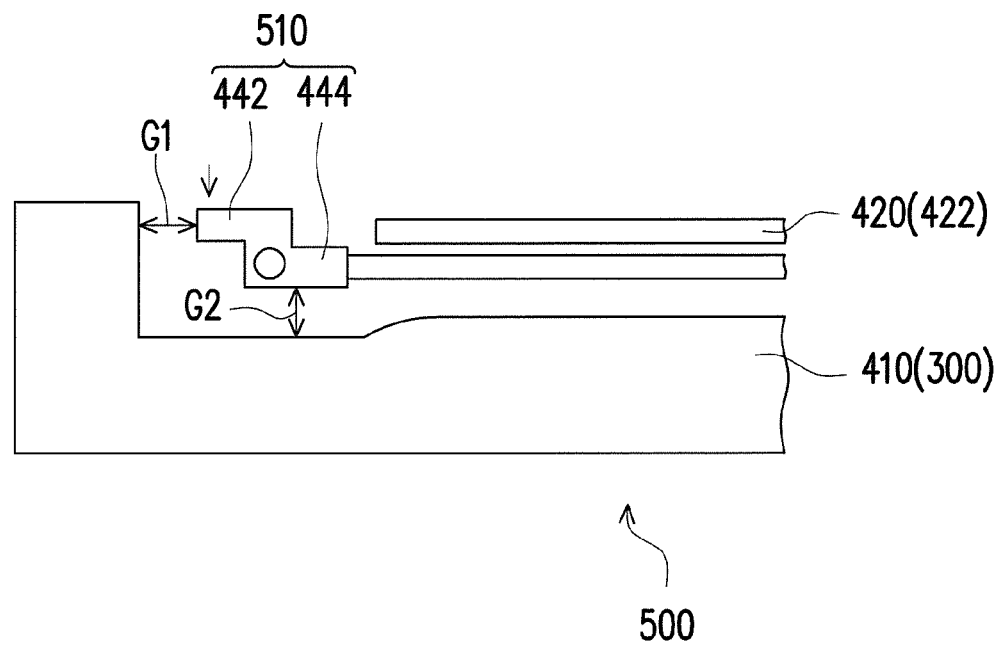
FIG. 7 is a schematic diagram illustrating a cover opening structure according to a second embodiment of the invention.

FIG. 7 is a schematic diagram illustrating a cover opening structure according to a second embodiment of the invention. Referring to FIG. 7, the present embodiment is substantially similar to the first embodiment, and thus identical or similar elements are indicated with the same or similar reference number, whereas differences lie in that: a cover opening structure 500 of the present embodiment, other than including the case 410, the cover 420 and the axle 450, the pushing button 430 described in the previous embodiment is replaced with a Z-shaped pressing button 510; and as compared to the first embodiment, which the first portion 422 of the cover 420 is being pushed up by moving the pushing button 430, the actuation means of the present embodiment is to press the pressing button 510 to push up the first portion 422 of the cover 420.

In detail, in the present embodiment, the pushing unit 440 of the first embodiment is inserted into the pressing button 510 and integrated with the pressing button 510, wherein a material of the pressing button 510 is plastic, and the pushing unit 440 may be a metal plate; however, in the other embodiments, the pushing unit 440 may also be integrally formed with the pressing button 510 by using same material. In addition, the axle 450 is disposed at the case 410, and the pressing button 510 is pivoted on the axle 450, exposed outside of the case 410 and suitable for rotating about the axle 450 in relative to the case 410, wherein the first end 442 of the pressing button 510 is exposed outside of the case 410 and the second end 444 leans against the first portion 422 of the cover 420.

Moreover, in response to the rotation of the pressing button 510, rotation gaps G1 and G2 are configured between the pressing button 510 and the case 410 to provide a rotation space for the pressing button 510.

Continuously referring to FIG. 7, when the user is to open up the cover 420 in relative to the case 410 of the electronic device 300, the user applies force to the first end 442 of the pressing button 510, and when the first end 442 is subjected by pressure while the pressing button 510 rotates about the axle 450 in relative to the case 410, the second end 444 rotates upward to push up the first portion 422 of the cover 420.

In summary, as the cover opening structure of the invention is applied to the electronic device, the user may enable the first portion of the cover to detach from the case in advance by means of the press button or the pushing button, and then the user may lift up the cover in relative to the case of the electronic device with less strength. Therefore, in terms is of the user, the greatest strength lies in detaching the first portion of the cover from the case; however, it takes less strength by adopting the cover opening structure, thereby having an ease of use.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. A cover opening structure comprising:
   a case;
   a cover having at least one first portion, a second portion and a connecting portion connected to the first portion and the second portion, wherein the connecting portion is softer than the first portion and the second portion, the first portion has a first side and the second portion has a second side, wherein the second side is connected to the case;
   a pushing button disposed on the case and suitable for moving horizontally relative to the case, wherein the pushing button has a body and an inserting portion extended from the body;
   a pushing unit having a first end, a second end and a leaning portion connected between the first end and the second end, and the inserting portion located between the body and the first end; and
   an axle disposed at the case, the leaning portion leaning against the axle, and the inserting portion enabling the pushing unit to rotate about the axle while the first end moves downward and the second end moves upward when the inserting portion of the pushing button presses against the first end of the pushing unit towards the case as the pushing button is moved horizontally relative to the case, so as to push up the first portion of the cover.

2. The cover opening structure as recited in claim 1, wherein a material of the pushing unit is metal.

3. The cover opening structure as recited in claim 1, wherein the cover further comprises a pulling rod portion disposed at the first side of the first portion.

4. The cover opening structure as recited in claim 3, wherein hardness of the pulling rod portion s greater than hardness of the connecting portion.

5. The cover opening structure as recited in claim 1, wherein a material of the pushing button is plastic.

6. The cover opening structure as recited in claim 1, wherein the case is a case of an electronic device.

* * * * *